United States Patent
Landry et al.

(10) Patent No.: US 6,563,437 B1
(45) Date of Patent: May 13, 2003

(54) METHOD AND APPARATUS FOR USING PROGRAMMABLE LOGIC DEVICE (PLD) LOGIC FOR DECOMPRESSION OF CONFIGURATION DATA

(75) Inventors: Greg J. Landry, Merrimack, NH (US); Timothy M. Lacey, Bedford, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/677,255

(22) Filed: Oct. 2, 2000

(51) Int. Cl.⁷ .......................... H03M 7/34; H03M 7/38; H04N 7/12; H04N 11/02; H04N 11/04
(52) U.S. Cl. .................... 341/51; 375/240.25
(58) Field of Search .............. 341/63, 67, 50, 341/51; 326/38; 710/74, 26; 713/193; 716/16; 257/679; 345/716, 543; 725/34; 358/1.2; 375/240.15; 382/233; 704/500; 708/402; 714/746

(56) References Cited

U.S. PATENT DOCUMENTS

| | | | | |
|---|---|---|---|---|
| 5,563,592 A | * | 10/1996 | Cliff et al. ..................... 341/63 |
| 5,731,629 A | * | 3/1998 | Woodward ..................... 257/679 |
| 5,745,734 A | * | 4/1998 | Craft et al. ..................... 716/16 |
| 5,768,372 A | * | 6/1998 | Sung et al. .................. 713/193 |
| 5,825,424 A | * | 10/1998 | Canfield et al. ........ 375/240.15 |
| 5,892,536 A | * | 4/1999 | Logan et al. .................. 725/34 |
| 5,940,072 A | * | 8/1999 | Jahangir et al. ............. 345/327 |
| 6,028,445 A | * | 2/2000 | Lawman ....................... 326/38 |
| 6,327,634 B1 | * | 12/2001 | Statovici ....................... 710/74 |

* cited by examiner

Primary Examiner—Patrick Wamsley
(74) Attorney, Agent, or Firm—Bradley T. Sako

(57) ABSTRACT

According to one embodiment, a method for programming a programmable logic device (PLD) may include reading configuration data from a memory device to program a first portion of a PLD to function as a data decompression circuit (304, 308). Compressed configuration data may then be read and decompressed by the first portion and used to program a second portion (310, 312, 315) with a user determined function. A first portion may then be reprogrammed with a user determined function (320, 324).

20 Claims, 10 Drawing Sheets

METHOD AND APPARATUS FOR USING PROGRAMMABLE LOGIC DEVICE (PLD) LOGIC FOR DECOMPRESSION OF CONFIGURATION DATA

TECHNICAL FIELD

The present invention relates generally to programmable logic devices (PLDs), and more particularly to PLDs that may be configured according to compressed configuration data stored in a memory device.

BACKGROUND OF THE INVENTION

Programmable logic has increasingly become a valued resource for system designers. Programmable logic can allow for a custom logic design to be implemented without the initial cost, delay and complexity of designing and fabricating an application specific integrated circuit (ASIC).

Currently, there are many variations of programmable logic, including simple programmable logic devices (SPLDs), complex PLDs (CPLDs), and field programmable gate arrays (FPGAs) (referred to herein collectively as programmable logic devices (PLDs)). Such devices typically include programmable logic circuits that can operate in conjunction with corresponding memory circuits. The particular function of a logic circuit can be determined according to data stored in a corresponding memory circuit. A memory circuit is typically a nonvolatile memory circuit, such as a programmable read-only-memory (PROM), an electrically programmable ROM (EPROM), and/or electrically erasable and programmable ROM (EEPROM), including "flash" EEPROMs.

As PLDs grow in size and complexity, the amount of configuration data for such PLDs can grow correspondingly. Thus, larger density memory devices may be required to store configuration data. Unfortunately, larger density memory devices may be more expensive and/or more difficult to procure than smaller density memory devices, and thus can increase the overall cost of a system.

In many configurations, in response to a particular event, such as the application of power (boot-up) or a reset condition, a PLD may receive configuration from a corresponding memory device. Such data may be in the form of a serial data stream.

To reduce the amount of memory that may be required to store configuration data and/or to reduce the amount time to transfer configuration data from a memory device to a PLD, configuration data may be "compressed." Compression may occur according to a predetermined algorithm. As but one example, a Huffman compression algorithm may map particular values to Huffman codes according to the frequency of occurrence for such values. However, conventional compression/decompression approaches may have drawbacks.

Referring now to FIG. 9, a conventional PLD programming approach 900 is shown that includes a PLD 902 and an associated read-only-memory (ROM) 904. A ROM 904 may store configuration data that has been compressed according to a predetermined algorithm. A PLD 902 may include a decompression circuit 906 and programmable logic circuits 908. A decompression circuit 906 may include fixed circuits designed to execute a predetermined decompression algorithm.

In response to a predetermined condition (e.g., boot-up or reset), a PLD 902 may communicate with a ROM 904 and read configuration data that can establish the function of programmable logic circuits 908. Because such configuration data may be compressed, decompression circuit 906 may decompress configuration data before the data is programmed into programmable logic circuits 908.

The use of compressed configuration data and an integrated fixed decompression circuit can reduce the amount of ROM storage that may be required to configure a PLD. However, such an approach may include inherent drawbacks.

One drawback to a conventional approach, such as that shown in FIG. 9, can be the additional area on a PLD die that a decompression circuit may consume. That is, a decompression circuit can consume die area that might otherwise be dedicated additional programmable logic circuits. Such increases in die size can translate into increased cost, as fewer dice may be formed on a semiconductor wafer.

Another drawback to conventional approaches, such as that shown in FIG. 9, can be lack of flexibility. In particular, for optimum efficiency and/or ease of use, it can be desirable to compress configuration data using any of a variety of approaches/algorithms. However, because a decompression circuit (such as that shown as 906 in FIG. 9) can be designed for one particular form of compression, such conventional approaches may only accommodate one type of compression/decompression.

FIG. 10 shows a conventional method of programming a PLD. A conventional method is shown in a block diagram and designated by the general reference character 1000. A conventional method may first include initiating a configuration operation (step 1002). Such a step may include establishing that a memory device and PLD are functioning properly, and initiating a communication path between a PLD and a memory device.

A conventional method 1000 car further include reading compressed data 1004 from a memory device (step 1006). Such a step may include reading data from a predetermined set of addresses. Data may be compressed according to a compression algorithm.

Compressed data may then be decompressed (step 1008). Such a step may include applying compressed data to circuits that are designed to decompress according to a particular decompression algorithm.

Uncompressed data may then be programmed into a PLD to establish the function of the PLD (step 1010). If all compressed configuration data has not been read and programmed, a method may repeat steps 1006 to 1010. If the last of the configuration data has been read and programmed, programming operations can end (steps 1012).

In light of the above discussion, it would desirable to arrive at some way of decompressing configuration data for a PLD that does not necessarily consume as much die area on a PLD as conventional approaches.

It would also be desirable to arrive at some way of providing a way of decompressing configuration data for a PLD that may accommodate more types of compression than conventional approaches.

SUMMARY OF THE INVENTION

The present invention includes a programmable logic device (PLD) and programming method for a PLD. According to various embodiments, a PLD may provide more efficient use of die area and/or more flexibility when being programmed with compressed configuration data.

According to one aspect of the embodiments, a first portion of a PLD may be programmed to function as a particular decompression circuit. A decompression circuit of a first portion may then decompress compressed configuration data for a second portion of the PLD. If desired, the first portion may then be reprogrammed to perform some other function. In addition, or alternatively, a first portion may be reprogrammed to provide a different decompression function.

According to another aspect of the embodiments, a first portion of a PLD can have a reset configuration that includes a decompression circuit. A decompression circuit of a first portion may then decompress compressed configuration data for a second portion of the PLD. A first portion may then be reprogrammed as noted above.

According to another aspect of the embodiments, a PLD may include a number of selectable fixed decompression circuits integrated on the same die as programmable circuits. One of the fixed decompression circuits can be selected to decompress compressed configuration data for programming the programmable circuits.

DETAILED DESCRIPTION OF THE EMBODIMENTS

Various embodiments will now be described in conjunction with a number of diagrams. The embodiments set forth a method and apparatus for configuring a programmable logic device (PLD) with configuration data stored in a memory device. A first portion of a PLD may be programmed to decompress data from a memory device. Such decompressed data may configure a second portion of a PLD to perform a predetermined function. A first portion of a PLD, that was previously configured to decompress data, may then be re-programmed to also perform a predetermined function.

Figure 1:
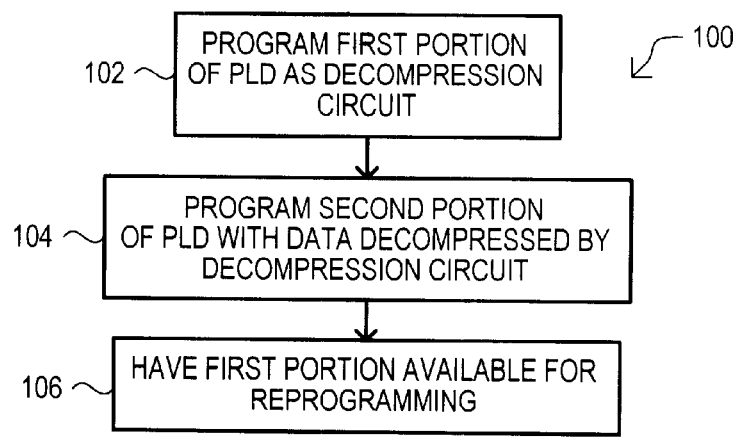
FIG. 1 is a flow diagram of a method according to a first embodiment.

A first embodiment will now be described with reference to FIGS. 1 and 2A to 2C. Referring now to FIG. 1, a block diagram is set forth illustrating a method of programming a PLD according to a first embodiment. A programming method is designated by the general reference character 100, and may include programming a first portion of a PLD as a decompression circuit (step 102). A step 102 may include expressing a decompression circuit according to a higher-level design language, and then synthesizing the design into a logic circuit configuration. An end product of such steps can be configuration data that sets programmable logic circuits to the desired decompression circuit configuration. Logic design and synthesis are steps that are well understood in the art.

Figures 2A, 2B:
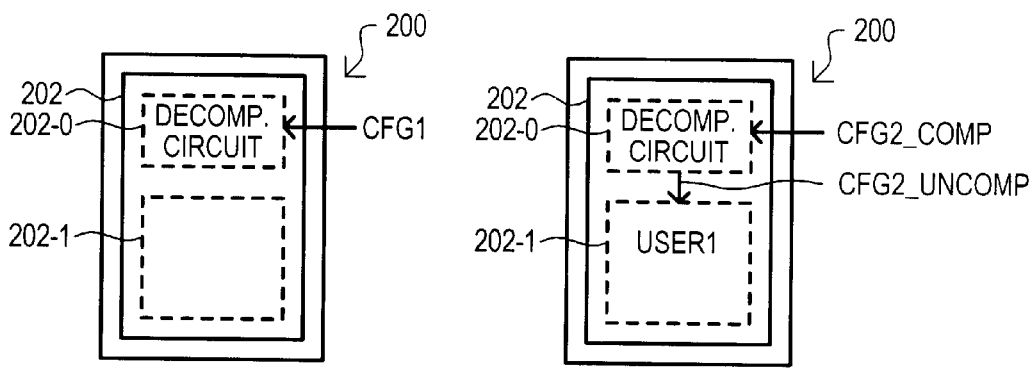
FIGS. 2A to 2C are block diagrams of a programmable logic device (PLD) according to the first embodiment.
Figure 2C:
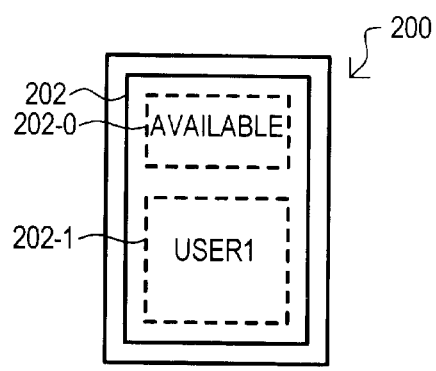

FIG. 2A shows one example of a PLD 200 following a step 102. A PLD 200 may include programmable circuits 202 that may be conceptualized as including a first portion 202-0 and a second portion 202-1. It is understood that first and second portions (202-0 and 202-1) may or may not be physically separate from one another, and may include portions of the same programmable logic circuits that are capable of being separately programmed.

In FIG. 2A, a first set of configuration data (CGF1) can be programmed to a PLD 200 to configure a first portion 202-0 as a data decompression circuit. It is noted that the particular type of data decompression performed by a data decompression circuit may be established by CFG1 data. In this way, a first embodiment is not necessarily limited to one type of decompression algorithm, providing flexibility over conventional approaches. Programming a PLD 200 to configure a first portion 202-0 may also include resetting programmable circuits into one or more predetermined decompression functions. In addition or alternatively, programming a PLD 200 can include selecting one of a number of fixed decompression circuits formed in a PLD 200. In one particular arrangement, such a selection of a fixed decompression circuit may include reading selection data from a memory device and selecting a fixed decompression circuit according to such selection data.

A programming method 100 may further include programming a second portion of a PLD with data decompressed by a first portion (step 104). Such a step may include writing configuration data into storage circuits within a PLD that can establish a PLD function.

FIG. 2B shows one example of a PLD 200 following a step 104. A first portion 202-0, configured as a decompression circuit, may receive compressed configuration data CFG2_COMP. Compressed configuration data CFG2_COMP can be decompressed in a first portion 202-0 to generate uncompressed configuration data CFG2_UNCOMP. Uncompressed configuration data CFG2_UNCOMP can then establish the function of a second portion 202-1 of a PLD 200. The configuration of a second portion 202-1 is represented in FIG. 2B by a "USER1" notation in a second portion.

A programming method 100 can then include having the first portion 202-0 of a PLD 100 available for re-programming (step 106). That is, while a first portion 202-0 may have been programmed to function as a decompression circuit, such a portion 202-0 can now be available for reprogramming. As but one example, the CFG2_UNCOMP data may provide only part of a design, and by re-programming a first portion 202-0, such a design may be completed. A portion 202-0 may be re-programmed by reading compressed configuration from a memory device. Such compressed configuration data may then be decompressed while a portion 202-0 remains configured as a decompression circuit. Decompressed configuration data may then be stored.

In this way, data decompression functions may be provided for a PLD while enabling such a PLD to be more compact and/or have more area dedicated to programmable logic circuits than conventional approaches. A PLD may be more compact as area does not have to be dedicated to a fixed decompression circuit. Alternatively, area that would be dedicated to a fixed decompression circuit in a conventional case can be filled with programmable circuits.

Figure 3:
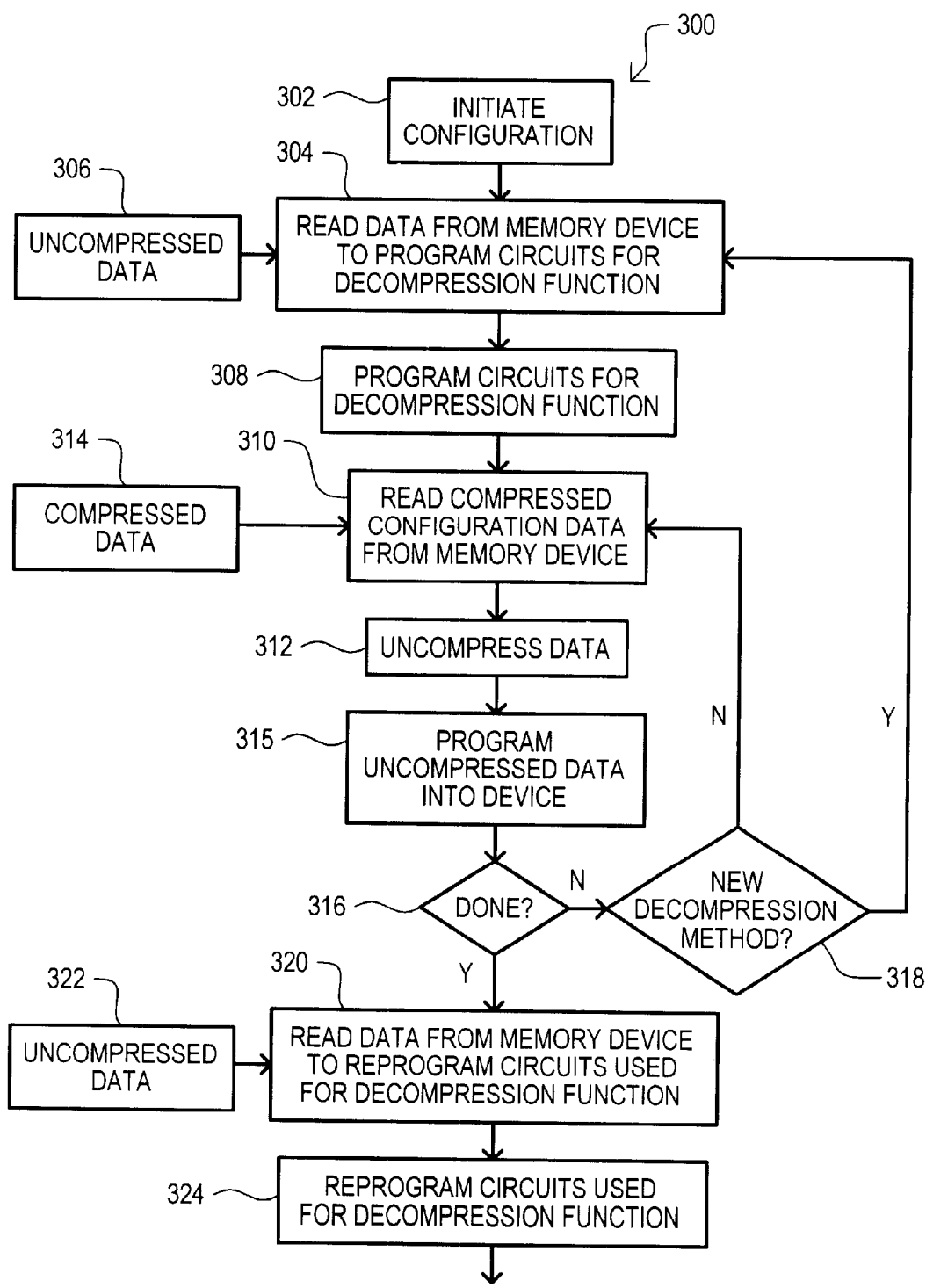
FIG. 3 is a flow diagram of a method according to a second embodiment.

A second embodiment will now be described with reference to FIGS. 3 and 4A to 4G. Referring now to FIG. 3, a block diagram is set forth illustrating a method of programming a PLD according to a second embodiment. The programming method of FIG. 3 is designated by the general reference character 300, and may include initially configuring a PLD and a memory device for a programming operation (step 302). A step 302 may include ensuring a memory device and PLD are operational, and that a communication path exists between such devices.

Figure 4A:
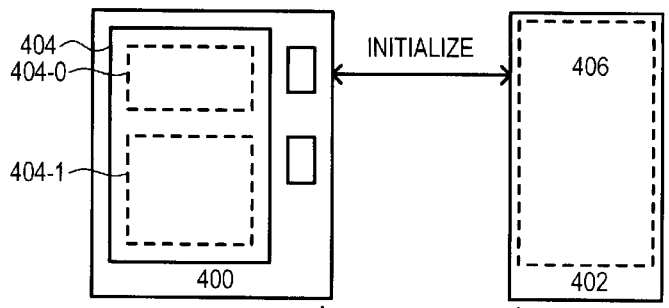
FIGS. 4A to 4G are block diagrams of a PLD and memory device according the second embodiment.

FIG. 4A shows a PLD 400 and memory device 402 corresponding to a step 302. A PLD 400 may include programmable circuits 404 that may be configured according to configuration information. As in the case of the PLD 200 of FIGS. 2A to 2C, programmable circuits 404 may include at least a first portion 404-0 and a second portion 404-1. A memory device 402 may include various memory locations that can store configuration information for a PLD 400. A memory device 402 may include storage locations 406 that may be read to provide configuration information to a PLD 400.

It is noted that in one arrangement, a PLD and memory device may be separate integrated circuits formed in the same assembly and/or system. However, alternate arrangements may include a PLD and memory device that are formed on the same substrate (i.e., a PLD with an integrated ROM or a ROM with an integrated PLD). Still further, it is understood that a PLD does not necessarily have to be formed on a different area than a memory device. As but one example, some programmable logic circuits can include cells with both nonvolatile and volatile circuit elements. Such arrangements can be conceptualized as having a memory device intermixed with a PLD.

Referring back to FIG. 3, a second embodiment 300 may further include reading configuration data from a memory device for a decompression circuit (step 304). As shown in FIG. 3, such configuration data can be in uncompressed form 306. A step 304 may include reading configuration data from predetermined locations in a memory device to storage locations within a PLD.

Figure 4B:
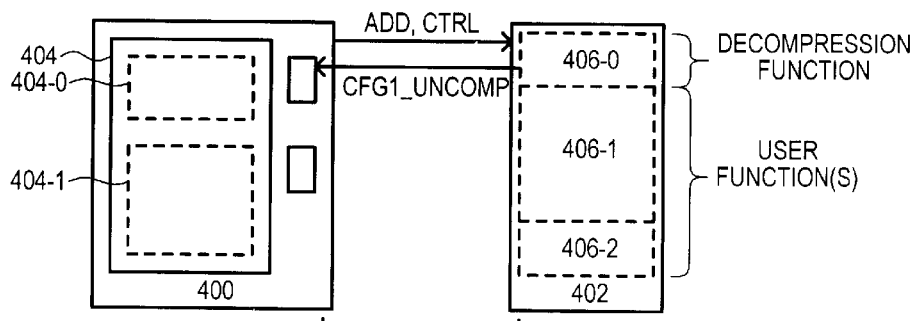

FIG. 4B shows a PLD 400 and memory device 402 corresponding to a step 304. A PLD 400 may generate address and control signals (ADD and CTRL) for a memory device 402. A memory device 402 may return configuration data CFG1__UNCOMP. Configuration data CFG1__UNCOMP may be in uncompressed form, and include configuration information that can program a portion of a PLD to function as one or more particular data decompression circuits. In one particular arrangement, configuration data CFG1__UNCOMP may be read from nonvolatile storage locations in a memory device 402 to volatile storage locations in a PLD 400.

FIG. 4B also shows particular storage locations in a memory device 402. A memory device 402 may include first storage locations 406-0, second storage locations 406-1 and third storage locations 406-2. First storage locations 406-0 may store uncompressed configuration data CFG1__UNCOMP that, as noted above, can configure a first portion of a PLD to function as a decompression circuit. Second storage locations 406-1 may store compressed configuration data CFG2__COMP. Compressed configuration data CFG2__COMP may be configuration data for a second portion of a PLD. Compressed configuration data CFG2__COMP may configure a second portion of a PLD for a desired function, such as that of a PLD user. Third storage locations 406-2 may store uncompressed configuration data CFG3__UNCOMP. Uncompressed data CFG3__UNCOMP may re-configure a first portion of a PLD from functioning as a decompression circuit, to some other function, such as that of a PLD user.

FIG. 4B also shows one particular representation of a data stored in a memory device 402. That is, uncompressed configuration data in first storage locations 406-0 can correspond to a decompression function, while compressed and uncompressed configuration data in second and third storage locations 406-1 and 406-2 can correspond to one or more user defined functions.

It is understood that while first, second, and third storage locations (406-0 to 406-2) are represented in a particular way in FIG. 4B, such storage locations are not necessarily stored in a particular order, or represent contiguous locations. Such storage locations (406-0 to 406-2) may, however, be accessible for a PLD 400 according to predetermined criteria.

Thus, according to one embodiment, a memory device may store uncompressed decompression circuit configuration data for a first PLD portion, compressed user configuration data for a second portion of a PLD, and uncompressed user configuration data for the first portion of a PLD. This is in contrast to conventional approaches, which can include a memory device that stores only compressed configuration data or uncompressed configuration data.

As shown in FIG. 3, a second embodiment 300 may include programming a first portion of a PLD to function as a decompression circuit (step 308). A step 308 may include configuring logic circuits according to previously read configuration data CFG1__UNCOMP.

Figure 4C:
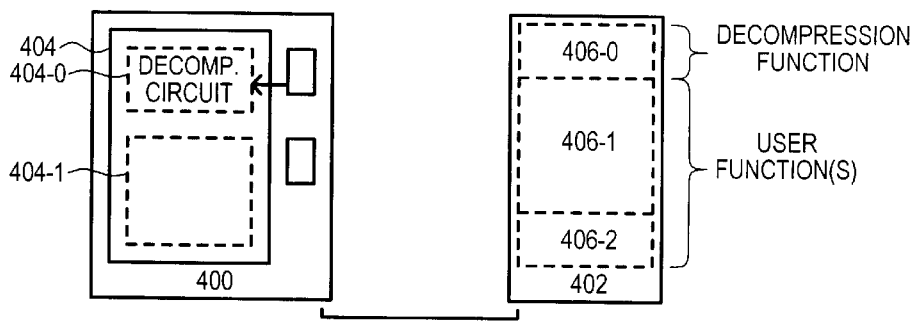

FIG. 4C shows a PLD 400 and memory device 402 corresponding to a step 308. Uncompressed configuration data can be applied to a first portion 404-0 of a PLD 400 to configure a first portion 404-0 into one or more data decompression circuits.

Referring again to FIG. 3, a second embodiment 300 may further include reading compressed configuration data 314 from a memory device (step 310), and then decompressing such data (step 312). A step 310 may include reading compressed configuration data from predetermined locations in a memory device. A step 312 may include decompressing such configuration data.

Figure 4D:
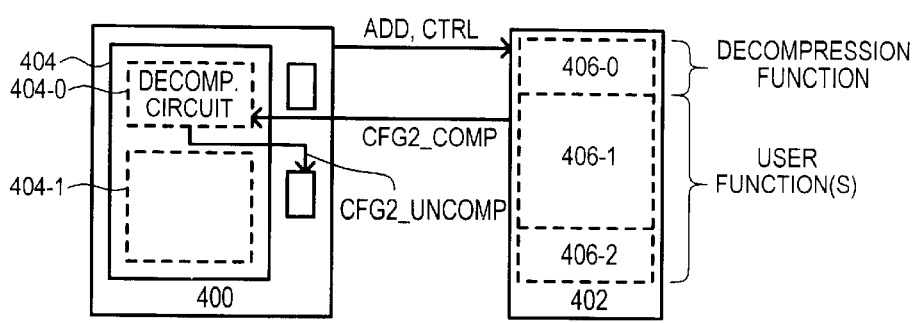

FIG. 4D shows a PLD 400 and memory device 402 corresponding to steps 310 and 312. A PLD 400 may generate address and control signals (ADD and CTRL) for a memory device 402, which may then return compressed configuration data CFG2__COMP. Compressed configuration data may include configuration information that can program a portion of a PLD to a desired function. In one particular arrangement, configuration data CFG2__COMP may be read from nonvolatile storage locations in a memory device 402 to a first portion 404-0 configured as a decompression circuit.

As also shown in FIG. 4D, compressed data CFG2__COMP received by a first portion 404-0 may be decompressed and provided as corresponding uncompressed output data CFG2__UNCOMP. In one particular arrangement, uncompressed configuration data CFG2__UNCOMP may be stored in volatile storage locations in a PLD 400.

A second embodiment 300 may continue by programming a second portion of a PLD according to data decompressed by a first portion of the PLD (step 315). A step 315 may include configuring logic circuits in a second portion according to previously read and decompressed configuration data CFG2__UNCOMP.

Figure 4E:
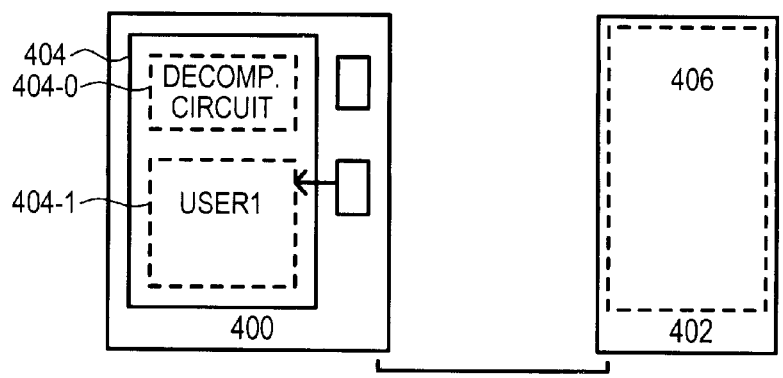

FIG. 4E shows a PLD 400 and memory device 402 corresponding to a step 315. Uncompressed configuration data can be applied to a second portion 404-1 of a PLD 400 to configure the second portion 404-1. In the example of FIG. 4E, a second portion 404-1 has been configured to perform a user-determined function, and so is identified with "USER1" notation.

In this way, a portion of a PLD may be programmed as a data decompression circuit for decompressing data used to program another portion of the PLD.

Referring once again to FIG. 3, a method may continue decompressing configuration data and programming resulting uncompressed data until a particular programming operation is complete (step 316). If a programming operation is not complete, a second embodiment method 300 may continue according to whether a new decompression method may be used (step 318). If a new decompression method is not needed, a method 300 may return to step 310 and continue decompressing and programming configuration data. If a new decompression method is needed, a method 300 may return to step 304 by reading uncompressed configuration data that can program a first portion of a PLD into a new decompression circuit. In this way, configuration data compressed by more than one method may be decompressed and loaded into a PLD. This can be more flexible than conventional approaches that may include one type of fixed decompression circuit capable of performing one type of data decompression.

If a programming operation is complete, a portion of a PLD previously programmed to function as a decompression circuit may be reprogrammed to perform another function, such as that desired by a user.

As shown in FIG. 3, a method 300 may include reading configuration data from a memory device that may be used to re-configure a first portion of a PLD from a decompression circuit to some other function (step 320). As shown in FIG. 3, such configuration data can be in uncompressed form 322. A step 320 may include reading configuration data from predetermined locations in a memory device to storage locations within a PLD.

Figure 4F:
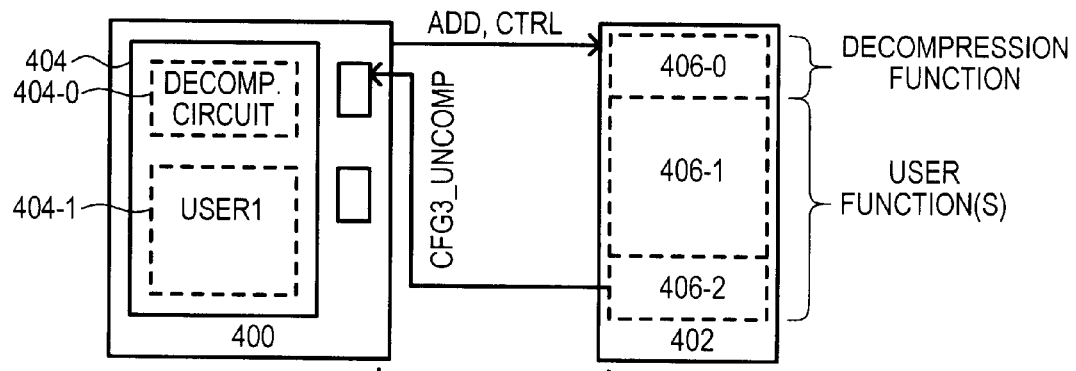

FIG. 4F shows a PLD 400 and memory device 402 corresponding to a step 320. A PLD 400 may generate address and control signals (ADD and CTRL) for a memory device 402. A memory device 402 may return configuration data CFG3_UNCOMP. Configuration data CFG3_UNCOMP may be uncompressed form, and include configuration information that can program a first portion 404-0 of a PLD to a desired function. In one particular arrangement, configuration data CFG3_UNCOMP may be read from nonvolatile storage locations in a memory device 402 to volatile storage locations in a PLD 400.

As shown in FIG. 3, a second embodiment 300 may include reprogramming a first portion according to previously read configuration data (step 324).

Figure 4G:
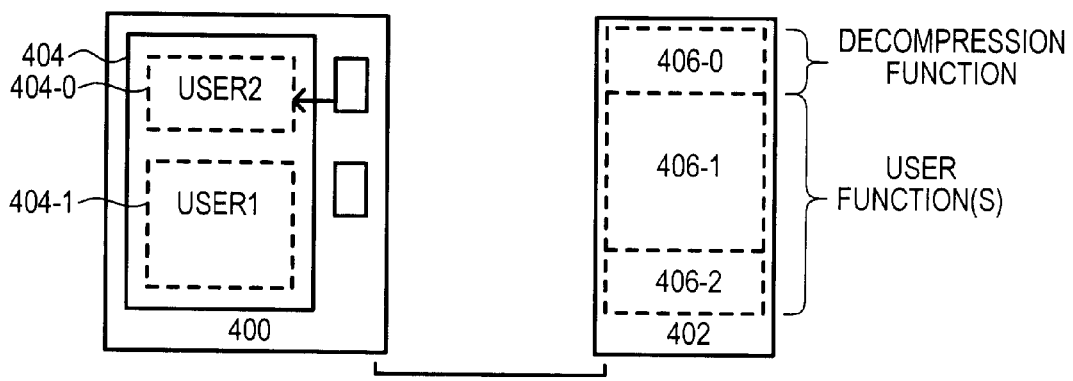

FIG. 4G shows a PLD 400 and memory device 402 corresponding to a step 324. Uncompressed configuration data CFG3_UNCOMP can be applied to a first portion 404-0 of a PLD 400. In the example of FIG. 4G, a first portion 404-0 has been configured to perform a user-determined function, and so is identified with "USER2" notation. As noted above, USER1 and USER2 programmable logic configurations can be different portions of one overall design.

In this way, a portion of a PLD may be first configured as a data decompression circuit, and then subsequently reprogrammed to a desired user function. Thus, essentially no die area may have to be dedicated solely to the function of decompression, as programmable circuits that form a decompression circuit may be "re-used" for other functions.

A third embodiment will now be described with reference to FIGS. 5 and 6A to 6E. referring now to FIG. 5, a block diagram is set forth illustrating a method of programming a PLD according to a third embodiment. A programming method is designated by the general reference character 500, and may include initially configuring a PLD and a memory device for a programming operation (step 502). Such a step 502 may include the same general actions as step 302 described in conjunction with FIG. 3.

Figure 6A:
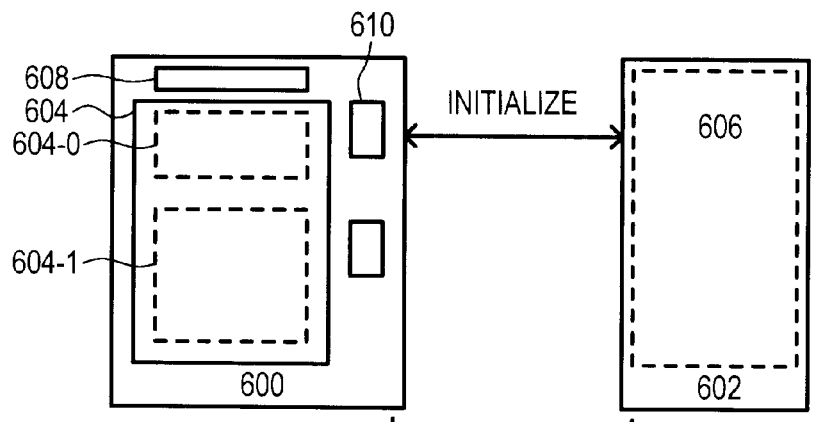
FIGS. 6A to 6E are block diagrams of a PLD and memory device according the third embodiment.

FIG. 6A shows a PLD 600 and memory device 602 corresponding to a step 502.

A method 500 may differ from other embodiments by including a decompression reset configuration on a PLD. For example, a PLD may include programmable circuits that can automatically reset to a predetermined configuration. In a third embodiment, such a predetermined configuration may include at least one data decompression circuit. A reset operation may be initiated in a number of ways. As but two examples, a reset may be initiated by an input, such as a control signal or a particular command, and/or by the absence and reapplication of power to the circuit. Further, a PLD reset circuit may take a variety of forms. As but a few of the possible examples, logic circuits may be designed to power-up into a reset configuration, and/or a PLD may include internal nonvolatile storage structures (e.g., a mask ROM, EPROM or EEPROM) that provide such configuration information, and/or a PLD may include a reset state machine that generates signals that establish a decompression circuit configuration. Of course, the above-listed examples should not be construed as limiting the invention thereto.

Figure 5:
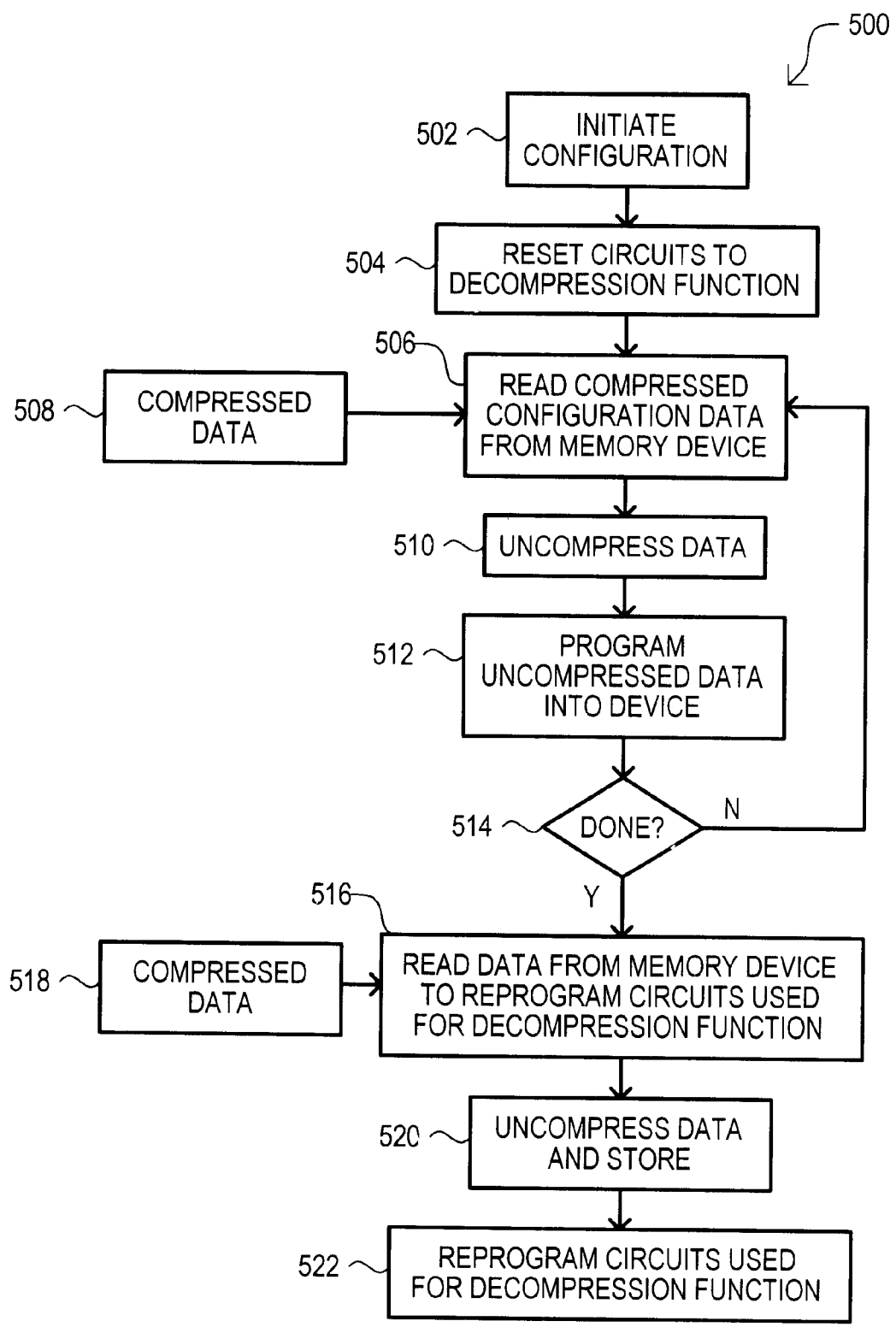
FIG. 5 is a flow diagram of a method according to a third embodiment.

Thus, as shown in FIG. 5, a method 500 may include resetting a PLD to place a PLD in a data decompression configuration (step 504).

Figure 6B:
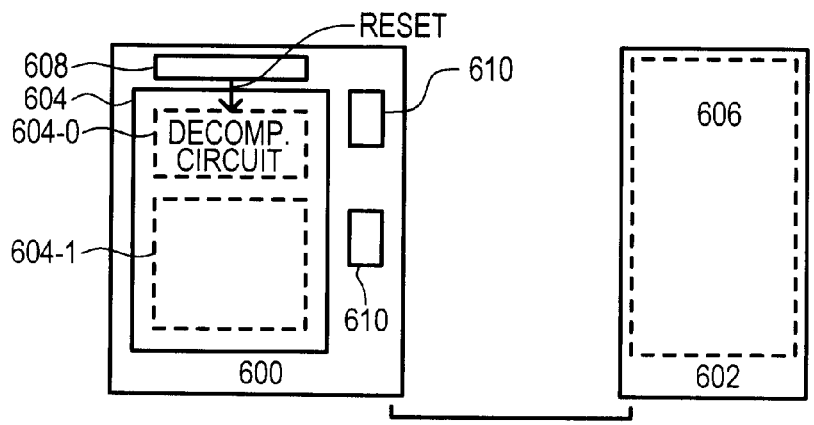

FIG. 6B shows a PLD 600 and memory device 602 corresponding to a step 504. Reset circuits 608 within a PLD 600 can configure at least a first portion 604-0 of programmable circuits 604 into at least one data decompression circuit.

Referring again to FIG. 5, having configured a data decompression circuit, a method 500 may continue with steps 506, 508, 510 and 512 which may occur in the same general fashion as steps 310, 312, 314, and 315 described in conjunction with FIG. 3. Namely, compressed configuration data may be read, decompressed, and then programmed into programmable circuits on a PLD.

Figure 6C:
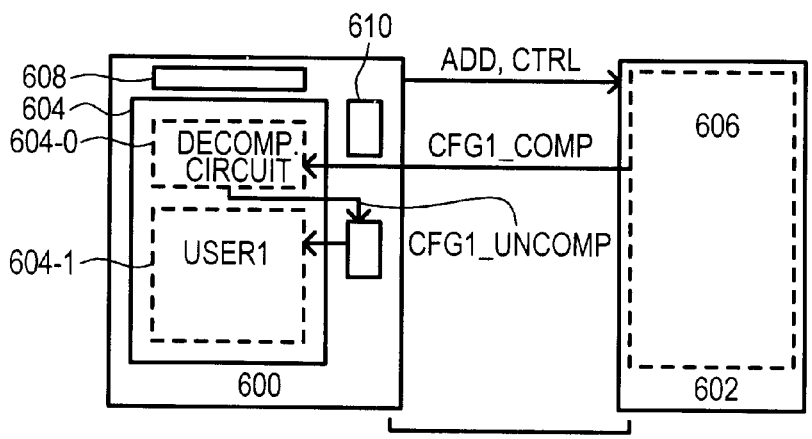

FIG. 6C shows an example of the various steps 506, 508, 510 and 512. As shown, compressed configuration data CFG1_COMP may be read into a PLD 600. A first portion 604-0 may decompress such data to produced uncompressed data CFG1_UNCOMP. Such data may then be used to program second portion 604-1.

As shown by step 514, steps 506, 508, 510 and 512 may be repeated until such programming is completed.

A third embodiment 500 may continue by reading additional configuration data from a memory device that may then be used to reprogram the circuits that are currently configured as one or more decompression circuits. In particular, configuration data may be read from a memory device (step 516). Such configuration data may be in compressed form 518. Compressed configuration data may then be decompressed by decompression circuits previously formed in a reset operation. Resulting uncompressed data may then be stored (step 520). Such uncompressed configuration data may then be used to re-program those circuits previously configured as a decompression circuit (step 522).

Figure 6D:
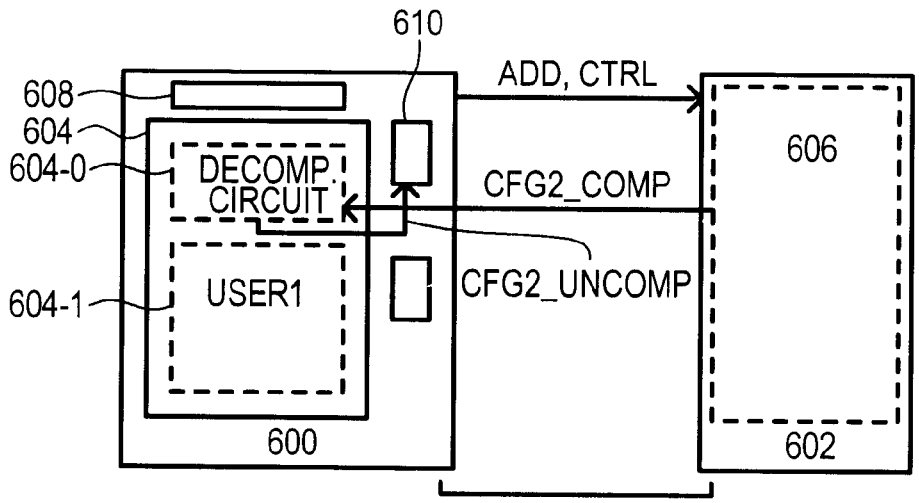

FIG. 6D shows an example of the various steps 516, 518, and 520. As shown, compressed configuration data CFG2_COMP may be read into a PLD 600. A first portion 604-0 may decompress such data to produce uncompressed data CFG2_UNCOMP that may then be stored in a PLD storage 610.

Figure 6E:
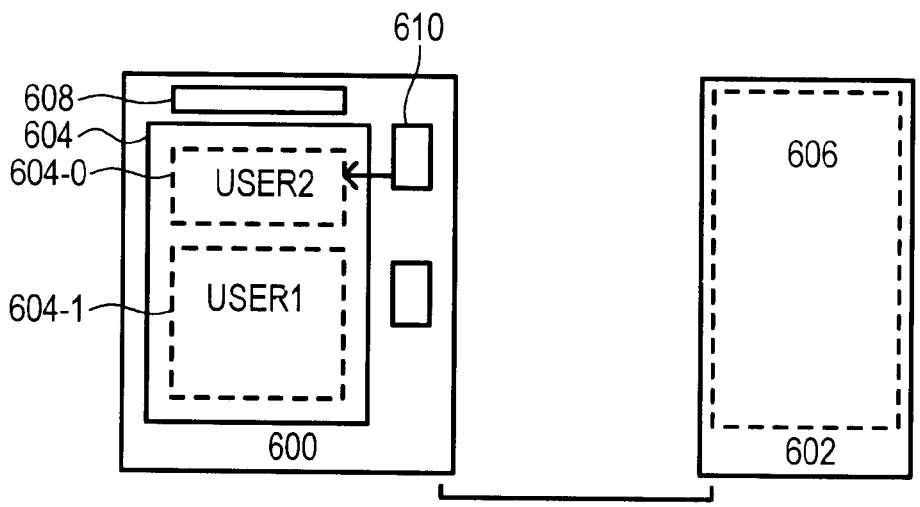

FIG. 6E shows a step 522. Namely, uncompressed configuration data may then configure a first portion 604-0. As in the previously described embodiment, in some arrangements, such a reprogramming can complete one overall user design.

Figure 7:
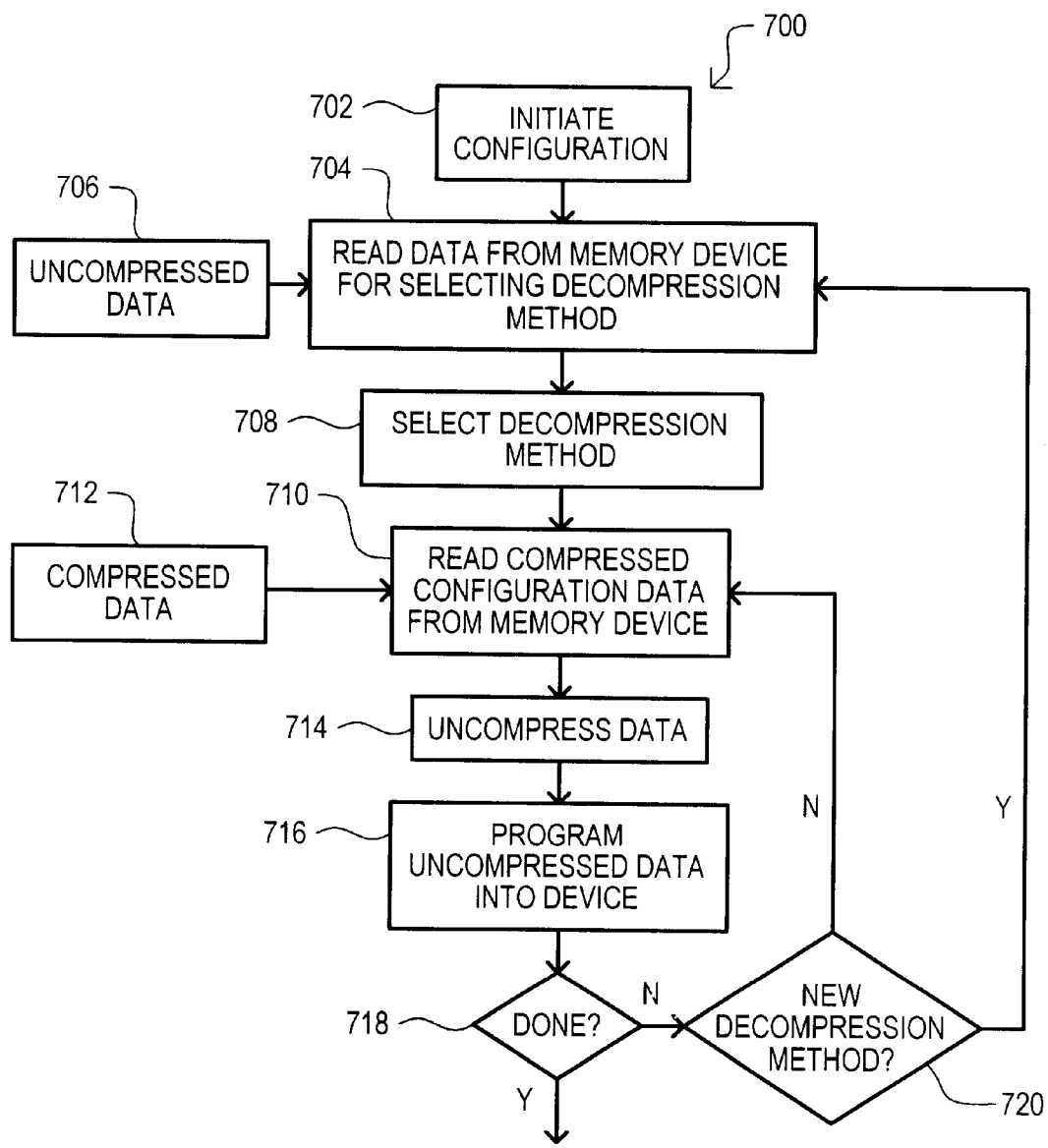
FIG. 7 is a flow diagram of a method according to a fourth embodiment.

A fourth embodiment will now be described with reference to FIGS. 7 and 8A to 8C. A block diagram of a method of programming a PLD according to a fourth embodiment is shown in FIG. 7 and designated by the general reference character 700. A fourth embodiment 700 and may initially include configuring a PLD and a memory device for a programming operation (step 702). Such a step 702 may include the same general actions as step 302 described in conjunction with FIG. 3.

Figure 8A:
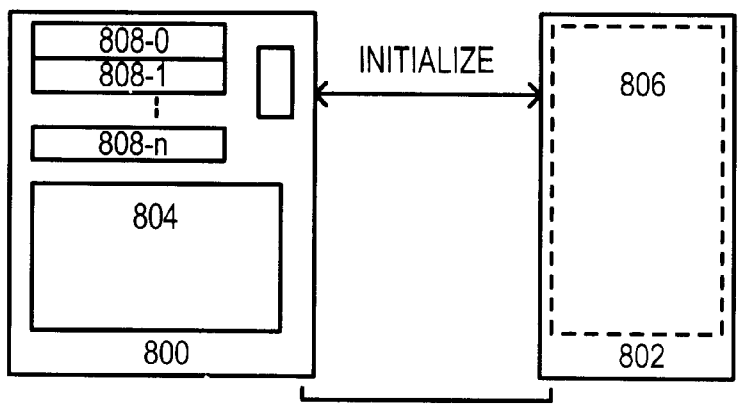
FIGS. 8A to 8C are block diagrams of a PLD and memory device according the fourth embodiment.

FIG. 8A shows a PLD 800 and memory device 802 corresponding to a step 702.

A method 700 may differ from other embodiments in that it may include selecting one of a number of decompression methods that may be executed by "fixed" circuits on a PLD. For example, a PLD may include not only programmable circuits, but also fixed circuits capable of executing one or multiple decompression methods. In this way, a PLD may be capable of performing more than one decompression method.

While a particular decompression method may be selected in a variety of ways, in the particular approach of FIG. 7, a decompression method may be selected by reading selection data from a memory device that can indicate a particular decompression method (step 704). Such selection data may be in uncompressed form 706. According to the selection data, a particular decompression method can be selected (step 708).

Figure 8B:
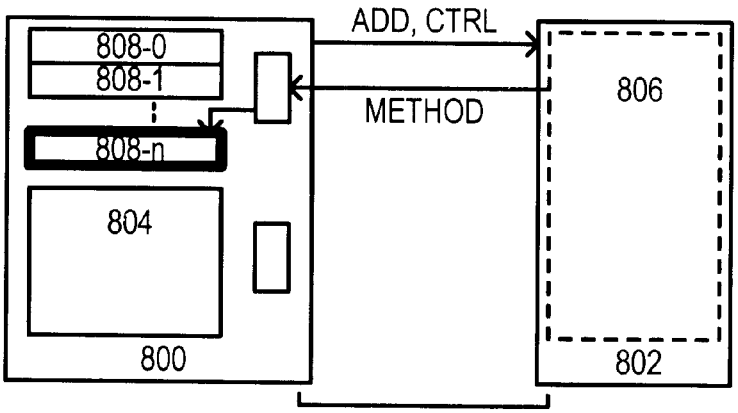

FIG. 8B shows a PLD 800 and memory device 802 corresponding to a step 704, 706 and 708. According to address and control signals generated by a PLD 800, selection data (shown as METHOD) may be read from a memory device 802. It is understood that selection data may take a variety of forms. As but one example, METHOD data may be a small group of bits, such as a single byte, that can indicate a particular decompression method. Selection data may then select one of a number of fixed decompression circuits 808-0 to 808-n.

Selection of a particular fixed decompression circuit (808-0 to 808-n) may occur in a variety of ways. As but two of the many possible examples, selection data may be decoded to generate one of a number of signals that may activate a particular decompression circuit. In addition, or alternatively, a PLD 800 may include multiplexer/switch type circuit that can be configured according to selection data to enable an input data path between a memory device 800 and one of the fixed decompression circuits (808-0 to 808-n).

Referring again to FIG. 7, once a particular decompression method is selected, a method 700 may continue with steps 710, 712, 714 and 716, which may occur in the same general fashion as steps 310, 312, 314, and 315 described in conjunction with FIG. 3. Namely, compressed configuration data may be read, decompressed by a selected decompression circuit, and then programmed into programmable circuits.

Figure 8C:
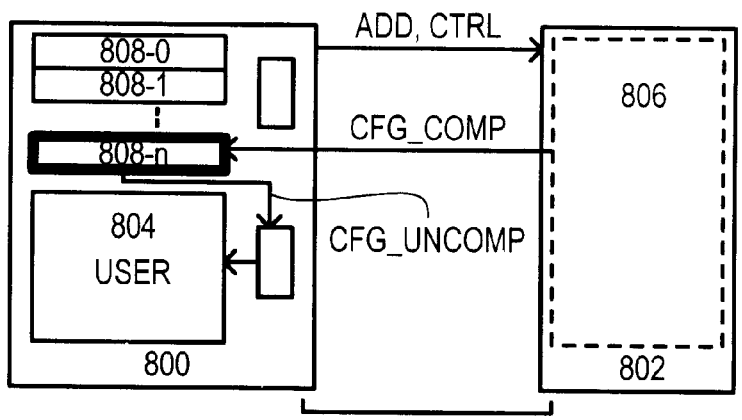
Figure 9:
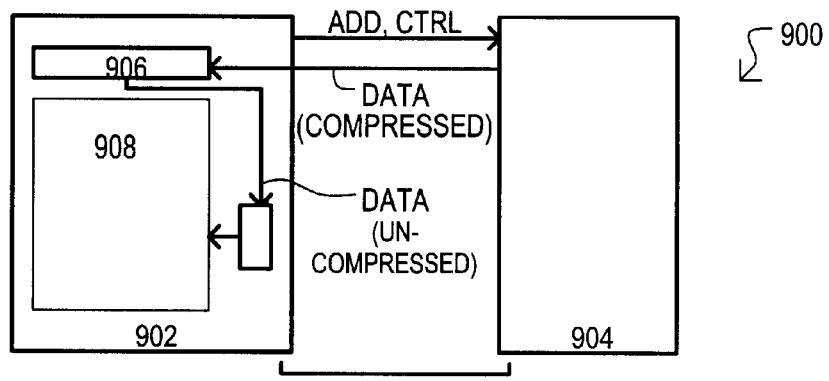
FIG. 9 is block diagram of a conventional system.
Figure 10:
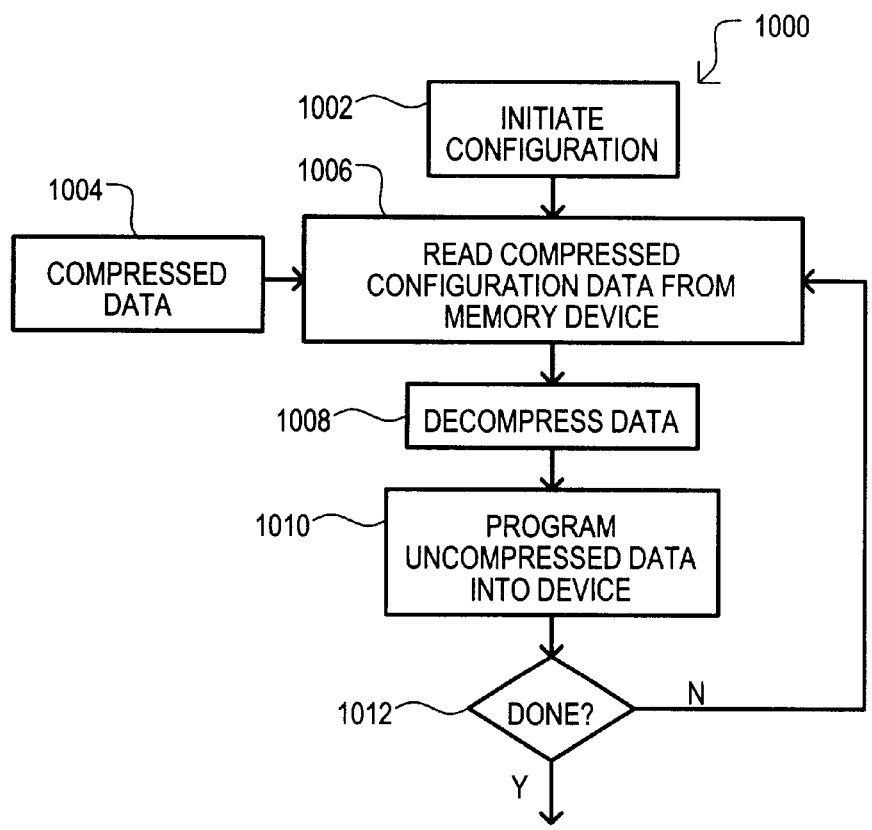
FIG. 10 is a flow chart of a conventional programming method.

FIG. 8C shows an example of the various steps 710, 712, 714 and 716. As shown, compressed configuration data CFG_COMP may be read into a PLD 800. A selected fixed decompression circuit (808-n, in the example shown) may decompress such data to produced uncompressed data CFG_UNCOMP. Such data may then be used to program programmable circuits 804 in a PLD 800.

As shown by steps 718 and 720, in a fourth embodiment 700, if a programming operation is not complete and a new decompression method is not desired, programming can continue with a repetition of steps 710, 712, 714 and 716. However, if a new decompression method is desired, a method may repeat beginning at step 704.

In this way, multiple decompression capabilities may be provided by fixed circuits on a PLD providing greater flexibility than conventional approaches.

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method, comprising the steps of:
   programming a first portion of programmable circuits to provide at least a first data decompression function; and
   decompressing configuration data with the first portion to program a second portion of the programmable circuits.

2. The method of claim 1, further including:
   reprogramming the first portion with configuration data.

3. The method of claim 2, wherein:
   reprogramming the first portion includes reading uncompressed configuration data from a memory device.

4. The method of claim 2, wherein:
   reprogramming the first portion includes reading compressed configuration data from a memory device, decompressing said configuration data with the first portion, and storing said decompressed configuration data.

5. The method of claim 1, wherein:
   programming a first portion includes reading uncompressed configuration data from a memory device.

6. The method of claim 1, wherein:
   decompressing configuration data includes reading compressed configuration data from a memory device.

7. The method of claim 1, wherein:
   programming a first portion includes resetting the programmable circuits into at least one predetermined decompression function.

8. The method of claim 1, further including:
   reprogramming a first portion to perform a second data decompression function that is different than the at least one first decompression function.

9. A method, comprising the steps of:
   enabling one of a plurality of decompression functions on a programmable logic device (PLD) having programmable circuits; and
   programming at least a portion of the programmable circuits according to configuration data decompressed on the PLD according to the enabled decompression function.

10. The method of claim 9, wherein:

enabling one of a plurality of decompression functions includes programming a first portion of the programmable circuits to perform at least one decompression function.

11. The method of claim 10, wherein:

enabling one of a plurality of decompression functions includes programming the first portion with decompressed configuration data read from a memory device; and programming at least a portion of the PLD includes programming a second portion of the programmable circuits according to compressed data read from the memory device that is decompressed by the first portion.

12. The method of claim 11, further including:

reprogramming the first portion to perform a different function than the one decompression function.

13. The method of claim 10, wherein:

enabling one of a plurality of decompression functions include selecting one of a plurality of fixed decompression circuits formed on the PLD.

14. The method of claim 13, wherein:

selecting one of a plurality of fixed decompression circuits includes reading selection data from a memory device, and selecting the one fixed decompression circuit according to said selection data.

15. The method of claim 10, wherein:

the PLD and memory device are different integrated circuits.

16. The method of claim 10, wherein:

enabling one of a plurality of decompression functions includes resetting the programmable circuits to a reset state that includes at least the one decompression function.

17. A semiconductor device, comprising:

programmable circuits that may be configured by configuration data; and fixed circuits formed in the same substrate as the programmable circuits, the fixed circuits providing one of a plurality of data decompression functions according to a select value.

18. The semiconductor device of claim 17, wherein:

the fixed circuits include a plurality of decompression circuits that each provide a different function, one of the fixed circuits being enabled according to the select value.

19. The semiconductor device of claim 17, wherein:

the fixed circuits include a plurality of decompression circuits that each provide a different function, access to one of the fixed circuits being enabled according to the select value.

20. The semiconductor device of claim 17, wherein:

the select value includes data r read from a memory device.

* * * * *